United States Patent
Gee et al.

(10) Patent No.: US 9,960,212 B2
(45) Date of Patent: May 1, 2018

(54) ORGANIC LIGHT EMITTING DIODE DISPLAY PANEL

(71) Applicant: LG Display Co., Ltd., Seoul (KR)

(72) Inventors: Moonbae Gee, Paju-si (KR); Hansun Park, Paju-si (KR); Dongwoo Song, Seoul (KR); Soohyun Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 14 days.

(21) Appl. No.: 14/713,245

(22) Filed: May 15, 2015

(65) Prior Publication Data

US 2015/0333107 A1     Nov. 19, 2015

(30) Foreign Application Priority Data

May 15, 2014   (KR) .......................... 10-2014-0058259

(51) Int. Cl.
 *H01L 27/32* (2006.01)
 *H01L 51/52* (2006.01)

(52) U.S. Cl.
 CPC ........ *H01L 27/322* (2013.01); *H01L 27/3209* (2013.01); *H01L 51/5281* (2013.01)

(58) Field of Classification Search
 CPC  H01L 51/5036; H01L 27/322; H01L 27/3209
 See application file for complete search history.

(56) References Cited

U.S. PATENT DOCUMENTS

| | | | | |
|---|---|---|---|---|
| 2002/0190257 A1* | 12/2002 | Yamazaki | ............. | H01L 27/322 257/72 |
| 2005/0275343 A1* | 12/2005 | Tanaka | ................ | H01L 51/5268 313/504 |
| 2007/0114519 A1* | 5/2007 | Hayashi | ............. | H01L 51/5246 257/40 |
| 2007/0114521 A1* | 5/2007 | Hayashi | ............. | H01L 51/5253 257/40 |
| 2012/0223307 A1* | 9/2012 | Sakata | ............. | H01L 21/02565 257/43 |
| 2015/0255520 A1* | 9/2015 | Seo | ..................... | H01L 27/3213 257/89 |

* cited by examiner

*Primary Examiner* — Jay C Chang
*Assistant Examiner* — Mikka Liu
(74) *Attorney, Agent, or Firm* — Fenwick & West LLP

(57) ABSTRACT

An organic light-emitting diode (OLED) display panel includes: an OLED layer; a color filter layer; and a color coordinate tuning layer disposed between the OLED layer and the color filter layer, wherein the OLED layer includes a first light-emitting portion comprising a first light-emitting layer configured to emit a first light and a second light-emitting portion comprising a second light-emitting layer configured to emit a second light. The OLED layer is configured to emit a third light produced by mixing the first light and the second light. The color coordinate tuning layer is configured to output a fourth light different from the third light. The number of all of peaks and shoulders that an EL spectrum of the fourth light has is higher than the number of all of peaks and shoulders that an EL spectrum of the third light has throughout an entire range of a visible wavelength band.

18 Claims, 5 Drawing Sheets

ORGANIC LIGHT EMITTING DIODE DISPLAY PANEL

CROSS-REFERENCE TO RELATED APPLICATIONS

This application claims the priority of Korean Patent Application No. 10-2014-0058259 filed on May 15, 2014, in the Korean Intellectual Property Office, the disclosure of which is incorporated herein by reference.

BACKGROUND

Field of Technology

The present disclosure relates to an organic light-emitting diode (OLED) display panel, and more specifically to an OLED display panel with an improved color gamut ratio.

Description of the Related Art

An organic light-emitting diode (OLED) is a device capable of producing light on its own. Accordingly, a lighter and thinner display device that does not require an additional light source, unlike a liquid crystal devices LCD, can be manufactured using OLEDs. Further, OLEDs have advantages in that they are driven with low voltage to thereby consume less power. Further, they reproduce better colors and have good response speed, wider viewing angle and good contrast ratio (CR). For these reasons, an OLED display panel using such OLEDs is currently under development as the next generation display device.

In order to produce light of full-color, an OLED display panel includes red, green and blue pixels. A red light-emitting layer, a green light-emitting layer and a blue light-emitting layer may be patterned in a red pixel, a green pixel and a blue pixel, respectively, using a fine metal mask (FMM).

As the latest display devices are equipped with high resolution, the demand for a larger screen is ever increasing. As display screens become larger, pixel patterning using a FMM may not be applicable due to misalignment. Misalignment occurs when a center portion of a FMM is drooped due to its weight and ultimately fails to form a light-emitting layer at a desired location.

In order to overcome the problem, a proposed method of stacking several common organic light-emitting layers on the entire surface of an OLED display panel has been proposed. More specifically, light generated in several organic light-emitting layers that are stacked on the entire surface of the device are mixed to produce white light. The white light passes through the color filter layer in each of pixels to be represented as red light, green light and blue light. Forming several common organic light-emitting layers in this manner does not require the use of a FMM. Accordingly, the possibility of misalignment caused by a FMM is eliminated.

SUMMARY

According to an aspect of the exemplary embodiments of the present disclosure, there is provided an organic light-emitting diode (OLED) display panel, including: an OLED layer; a color filter layer; and a color coordinate tuning layer disposed between the OLED layer and the color filter layer, wherein the OLED layer includes a first light-emitting portion (i.e. a first stack) comprising a first light-emitting layer configured to emit a first light and a second light-emitting portion (i.e. a second stack) comprising a second light-emitting layer configured to emit a second light. The OLED layer is configured to emit a third light produced by mixing the first light and the second light. The color coordinate tuning layer is configured to output a fourth light different from the third light. The number of all of peaks and shoulders that an EL spectrum of the fourth light has is higher than the number of all of peaks and shoulders that an EL spectrum of the third light has throughout an entire range of a visible wavelength band.

According to another aspect of the exemplary embodiments of the present disclosure, there is provided an organic light-emitting diode (OLED) display panel including: an OLED layer; a color filter layer; and a color coordinate tuning layer disposed between the OLED layer and the color filter layer. The OLED layer includes a first light-emitting portion comprising a first light-emitting layer configured to emit a first light and a second light-emitting portion comprising a second light-emitting layer configured to emit a second light. The OLED layer is configured to emit a third light produced by mixing the first light and the second light. The color coordinate tuning layer is configured so that the third light passes though the color coordinate tuning layer and to output a fourth light different from the third light. A broadness of a peak that an EL spectrum of the fourth light has is larger than a broadness of a peak that an EL spectrum of the third light has throughout an entire range of a visible wavelength band.

The color coordinate tuning layer may be configured to convert the third light into the fourth light such that a peak or a shoulder, which does not exist in the EL spectrum of the third light, exists in the EL spectrum of the fourth light.

A broadness of a peak that the EL spectrum of the fourth light has may be larger in a long wavelength band than in a short wavelength band. A broadness of a peak that the EL spectrum of the fourth light has in the long wavelength band may be larger than a broadness of a peak that the EL spectrum of the third light has in the long wavelength band.

The color coordinate tuning layer may be configured to convert the third light into the fourth light such that an intensity of a peak in the EL spectrum of the fourth light is lower than an intensity of a peak in the EL spectrum of the third light.

The color coordinate tuning layer may be configured to convert the third light into the fourth light such that a broadness of a peak in the EL spectrum of the fourth light is larger than a broadness of a peak in the EL spectrum of the third light.

The OLED layer may further include an upper electrode and a lower electrode facing each other. A refractive index of the color coordinate tuning layer may be smaller than a refractive index of one of the upper electrode and the lower electrode that is closer to the color coordinate tuning layer.

A color of the first light and a color of the second light may complement each other.

The third light and the fourth light may be white light.

One of the first light and the second light may be blue light and the other may be yellow-green light.

The EL spectrum of the fourth light may have a peak or a peak and a shoulder in a range of a red wavelength band.

The intensity of the EL spectrum of the fourth light may be higher than the intensity of the EL spectrum of the third light in a part of the range of the red wavelength band.

Particulars in the exemplary embodiments of the present disclosure will be described in the detail description with reference to the accompanying drawings.

According to the exemplary embodiments of the present disclosure, an OLED display panel can reduce the stacks of organic light-emitting layers for representing white color to thereby minimize increase in driving voltage.

In addition, according to the exemplary embodiments of the present disclosure, an OLED display panel can improve color gamut ratio.

Moreover, according to the exemplary embodiments of the present disclosure, an OLED display panel can exhibit good panel efficiency.

It should be noted that effects of the exemplary embodiments of the present invention are not limited to those described above and other effects of the exemplary embodiments of the present invention will be apparent to those skilled in the art from the following descriptions.

The summary of the invention is not to specify essential features of the appended claims, and thus the scope of the claims is not limited thereby.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION

Figure 1:
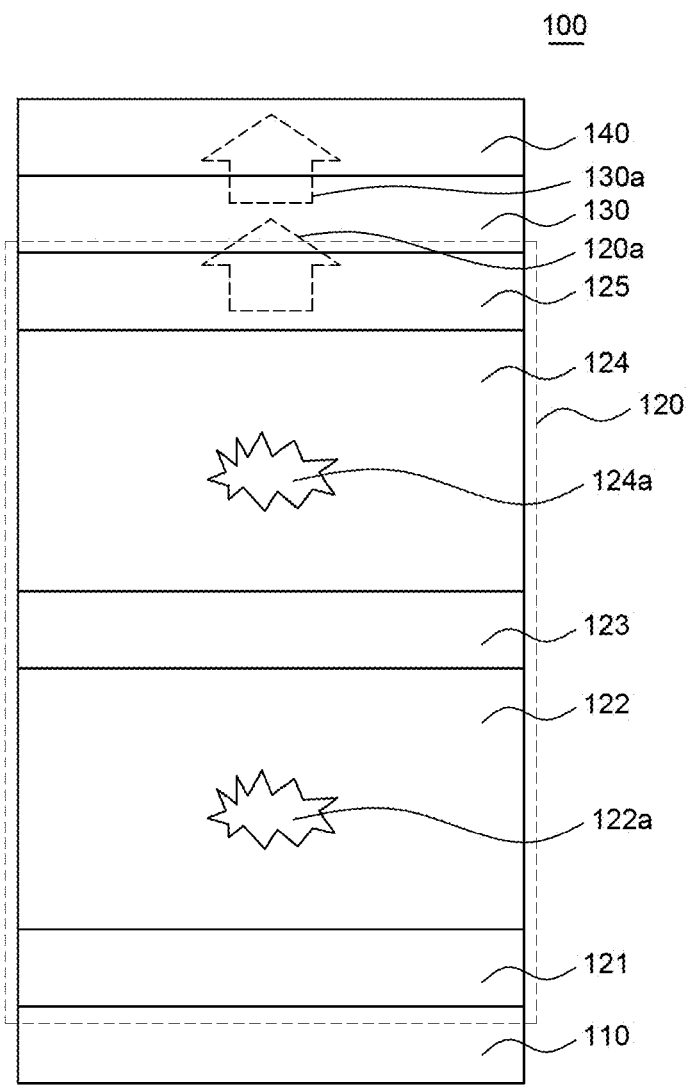
FIG. 1 is a diagram schematically showing a structure of an OLED display panel according to an exemplary embodiment of the present disclosure.

Advantages and features of the present disclosure and methods to achieve them will become apparent from the descriptions of exemplary embodiments herein below with reference to the accompanying drawings. However, the present disclosure is not limited to exemplary embodiments disclosed herein but may be implemented in various different ways. The exemplary embodiments are provided for making the disclosure of the present disclosure thorough and for fully conveying the scope of the present disclosure to those skilled in the art. It is to be noted that the scope of the present disclosure is defined only by the claims.

The figures, dimensions, ratios, angles, numbers of elements given in the drawings are merely illustrative and are not limiting. Like reference numerals denote like elements throughout the descriptions. Further, in describing the present disclosure, descriptions on well-known technologies may be omitted in order not to obscure the gist of the present disclosure.

It is to be noticed that the terms "comprising," "having," "including" and so on, used in the description and claims, should not be interpreted as being restricted to the means listed thereafter unless specifically stated otherwise.

As used herein, where an indefinite or definite article is used when referring to a singular noun, e.g. "a," "an," "the," this includes a plural of that noun unless specifically stated otherwise.

As used herein, in describing elements, they are interpreted as including error margins even without explicit statements.

As used herein, in describing positional relationship, such as "an element A on an element B," "an element A above an element B," "an element A below an element B," and "an element A next to an element B," another element C may be disposed between the elements A and B unless the term "directly," "immediately" or "in contact with" is explicitly used.

As used herein, the terms first, second, third and the like in the descriptions and in the claims are used for distinguishing between similar elements and not necessarily for describing a sequential or chronological order. These terms are used to merely distinguish one element from another. Accordingly, as used herein, a first element may be a second element within the technical idea of the present disclosure.

As used herein, a peak refers to a concave part of a curve where the second derivative is positive or negative. As used herein, a shoulder refers to a part of a curve where the curve switches from concave down to concave up or vice versa, i.e., an inflection point where the second derivative is zero.

As used herein, "a broadness of a peak" refers to a distance between a wavelength having the intensity of 0.05 at a shorter wavelength band (e.g. left side with respect to a peak-top-point) and a wavelength having the intensity of 0.05 at a longer wavelength band (e.g. right side with respect to a peak-top-point) with respect to the wavelength of the peak. In addition, "a broadness of a peak at a longer wavelength band" refers to a distance from the wavelength of the peak-top-point to a wavelength having the intensity of 0.05 at the longer wavelength band (e.g. right side with respect to a peak-top-point). In addition, "a broadness of a peak at a shorter wavelength band" refers to a distance from the wavelength of the peak to a wavelength having the intensity of 0.05 at the shorter wavelength band (e.g. left side with respect to a peak-top-point).

As used herein, "the entire range of the visible wavelength band" refers to a wavelength band from 380 nm to 770 nm.

As used herein, "EL spectrum" stands for electroluminescence spectrum, which is measured on the front surface of the device at a viewing angle of zero degree, unless otherwise specified.

As used herein, in comparing peaks of the EL spectrum of the third light with peaks of the EL spectrum of the fourth light, each peak-top-point of the peaks of the former is compared with respective that of peaks of the latter within 50 nm therefrom, respectively.

Features of various exemplary embodiments of the present disclosure may be combined partially or totally. As will be clearly appreciated by those skilled in the art, technically various interactions and operations are possible. Various exemplary embodiments can be practiced individually or in combination.

OLEDs according to various exemplary embodiment of the present disclosure will be described with reference to the accompanying drawings. In the drawings, a variety of layers of OLEDs according to exemplary embodiments of the present disclosure are drawn as a rectangular shape for convenience of illustration. In the drawings, the layers are shown as having clearly distinguishable front surface and a side surface. However, the layers may have a smooth surface across a front surface and a side surface. Accordingly, as used herein, an edge of a layer refers to a side surface when the layer has clearly distinguished front surface and side surface. It also corresponds to an edge of a front surface when the layer has a smooth boundary between a front surface and a side surface.

In the related art, for an OLED display panel implemented by way of stacking several common organic light-emitting layers on the entire surface of the display panel and causing light to pass through a color filter layer, there has been an ongoing research effort to achieve low driving voltage, good luminous efficiency and an improved color gamut ratio.

Unfortunately, as the number of organic light-emitting layers stacked for improving a color gamut ratio and luminous efficiency increases, the overall thickness of the OLED increases, resulting in an increase in driving voltage of the OLED. In addition, the manufacturing cost of the number of processes increases as the device becomes more complex. For example, in the state-of-the-art, only two organic light-emitting layers are stacked one on the other as a double-layer with a blue light-emitting layer and a yellow-green light-emitting layer. In this manner, however, no red light-emitting layer is used, weakening the brightness of red color on the emission spectrum.

That is, in view of the recent market trend that favors lower power consumption and higher image quality, it becomes an issue for a white OLED display panel that has to improve a color gamut ratio without making the structure complex or increasing driving voltage.

Accordingly, the inventors of the application have devised a white OLED display panel with an improved color gamut ratio and panel efficiency while reducing stacks of organic light-emitting layers.

FIG. 1 shows an OLED display panel according to an exemplary embodiment of the present disclosure. Specifically, FIG. 1 schematically shows a top-emission white OLED display panel.

Referring to FIG. 1, an OLED display panel 100 according to an exemplary embodiment of the present disclosure includes an organic light-emitting diode (OLED) layer 120, a color coordinate tuning layer 130 and a color filter layer 140 disposed on a substrate 110. The OLED layer 120 includes a lower electrode 121 and an upper electrode 125 facing each other. Further, a first light-emitting portion 122, a charge generating layer 123 and a second light-emitting portion 124 are stacked on one another between the lower electrode 121 and the upper electrode 125. More specifically, the first light-emitting portion 122 may be disposed on the lower electrode 121, the charge generating layer 123 may be disposed on the first light-emitting portion 122, the second light-emitting portion 124 may be disposed on the charge generating layer 123, and the upper electrode 125 may be disposed on the second light-emitting portion 124. The first light-emitting portion 122 may include a first light-emitting layer (not shown) producing a first light 122a. The second light-emitting portion 124 may include a second light-emitting layer (not shown) producing a second light 124a. Each of the first light-emitting portion 122 and the second light-emitting portion 124 may further include organic layers such as a hole injecting layer (not shown), a hole transporting layer (not shown), an electron injecting layer (not shown) and an electron transporting layer (not shown), for facilitating electron injection and transportation into the first light-emitting layer and the second light-emitting layer.

The substrate 110 may have a red pixel area (not shown), a green pixel area (not shown) and a blue pixel area (not shown) defined thereon. Alternatively, substrate 110 may have a red pixel area (not shown), a green pixel area (not shown) and a blue pixel area (not shown) and a white pixel area (not shown) defined thereon The upper electrode 125 is made of a material having good light transmissivity and electric conductivity. More specifically, the first light 122a and the second light 124a pass through the upper electrode 125 which is made of a material exhibiting good light transmissivity throughout the entire range of the visible wavelength band. In addition, the upper electrode 125 also acts as an electrode and is made of a material having good electric conductivity. That is, the upper electrode 125 may include a conductive material and may transmit light. The upper electrode 125 may be made of, but is not limited to, a transparent conductive oxide (hereinafter referred to as TCO) such as indium tin oxide (ITO), indium zinc oxide (IZO) and zinc oxide (ZnO). If the upper electrode 125 works as a cathode, electrons move between the second light-emitting layer and the upper electrode 125. If the upper electrode 125 works as an anode, holes move between the second light-emitting layer and the upper electrode 125.

The color of the first light 122a emitted from the first light-emitting portion 122 and the color of the second light 124a emitted from the second light-emitting portion 124 complement each other and are mixed to produce white light. For example, if the first light 122a emitted from the first light-emitting portion 122 is blue light, the second light 124a emitted from the second light-emitting portion 124 may be yellow-green light. If the first light 122a emitted from the first light-emitting portion 122 is yellow-green light, the second light 124a emitted from the second light-emitting portion 124 may be blue light For example, if the first light 122a emitted from the first light-emitting portion 122 has the highest luminous intensity in the range of the wavelength band from 430 nm to 480 nm, the second light 124a emitted from the second light-emitting portion 124 has the highest luminous intensity in the range of the wavelength band from 500 nm to 600 nm. In addition, if the first light 122a emitted from the first light-emitting portion 122 has the highest luminous intensity in the range of the wavelength band from 500 nm to 600 nm, the second light 124a emitted from the second light-emitting portion 124 has the highest luminous intensity in the range of the wavelength band from 430 nm to 480 nm. In this regard, the phrase "a light has the highest luminous intensity in a range of a wavelength band" refers to the light that has at least one peak in the entire range of the visible wavelength band and has the highest one in the range of the wavelength band. In other words, if a light has two or more peaks in the entire range of the visible wavelength band, the range of the wavelength band where the light has the highest luminous intensity refers to the range of the wavelength band where the highest peak exists.

The OLED layer 120, the color coordinate tuning layer 130 and the color filter layer 140 of the OLED display panel 100 according to an exemplary embodiment of the present disclosure will be described in more detail.

The OLED layer 120 emits a third light 120a produced by mixing the first light 122a and the second light 124a. The first light 122a and second light 124a may complement each other. The third light 120a may be white color. Throughout the entire range of the visible wavelength band, the EL spectrum of the third light 120a may have the peak by the first light 122a and the peak by the second light 124a. That is, the EL spectrum of the third light 120a may have a peak corresponding to blue light and a peak corresponding to yellow-green light. Alternatively, the EL spectrum of the third light 120a may have a peak in the range of wavelength band from 430 nm to 480 nm, and a peak in the range of wavelength band from 500 nm to 600 nm.

The color coordinate tuning layer 130 is a layer on which the third light 120a passed through the upper electrode 125 of the OLED layer 120 is incident. The refractive index of the color coordinate tuning layer 130 is smaller than that of the upper electrode 125 which is closer to the color coordinate tuning layer 130 than the other electrode of the OLED layer 120. For the wavelength of 550 nm, the difference in refractive index between the upper electrode 125 and the color coordinate tuning layer 130 may range from 0.15 to 0.35. The color coordinate tuning layer 130 may include one selected from a group consisting of titanium nitride (TiNx), titanium oxide (TiOx), titanium oxynitride (TiOxNy), silicon nitride ($SiN_x$), silicon oxide ($SiO_x$), silicon oxynitride ($SiO_xN_y$), aluminum nitride ($AlN_x$) aluminum oxide ($AlO_x$), aluminum oxynitride ($AlO_xN_y$), and a mixture thereof. The thickness of the color coordinate tuning layer 130 may range from 900 nm to 1,200 nm. For example, for the thickness of 1,000 nm and the wavelength of 550 nm, the color coordinate tuning layer 130 may be a single layer of silicon nitride having the refractive index of 1.85. Or, for the wavelength of 550 nm, the color coordinate tuning layer 130 having the thickness of 1,200 nm may be a single layer of aluminum oxide having the refractive index of 1.65. The color coordinate tuning layer 130 may be multiple layers comprised of a combination of the single-layers, if necessary.

The third light 120a is incident on the color coordinate tuning layer 130 so that a fourth light 130a is outputted from the color coordinate tuning layer 130. In other words, the third light 120a passes though the color coordinate tuning layer 130 and the coordinate tuning layer 130 outputs a fourth light 130a.

Although the color of the third light 120a and the color of the fourth light 130a is white, the EL spectrum of the fourth light 130a is different from that of the third light 120a. Specifically, the number of all peaks that the EL spectrum of the fourth light 130a has in the entire range of the visible wavelength band may be higher than the number of all peaks that the EL spectrum of the third light 120a has in the entire range of the visible wavelength band. For example, if the EL spectrum of the third light 120a has two peaks in the entire range of the visible wavelength band, the EL spectrum of the fourth light 130a may have three or more peaks in the entire range of the visible wavelength band. This means that the EL spectrum of the fourth light 130a may additionally have at least a peak-characteristic in the range of a wavelength band other than the ranges of the wavelength band where the EL spectrum of the first light 122a and the EL spectrum of the second light 124a have peak-characteristics, respectively. A peak-characteristic may be a peak or a shoulder, so the EL spectrum of the fourth light 130a does not necessarily have a peak but may have a shoulder as a peak-characteristic having increased intensity in a particular range of wavelength. In other words, the fourth light 130a exhibits three or more peak-characteristics in the EL spectrum of the fourth light 103a, and the peak-characteristics includes not only a peak but also a shoulder. For example, if the EL spectrum of the third light 120a has two peaks in the entire range of the visible wavelength band, the EL spectrum of the fourth light 130a may have three or more peaks and shoulders (e.g. three peaks, two peaks and one shoulder, or two peaks and two shoulders) in the entire range of the visible wavelength band.

That is, the number of all peaks and shoulders that the EL spectrum of the fourth light 130a has in the entire range of the visible wavelength band may be higher than the number of all peaks and shoulder that the EL spectrum of the third light 120a has in the entire range of the visible wavelength band. The integral of the EL spectrum of the third light 120a may be substantially equal to the integral of the EL spectrum of the fourth light 130a with a margin of error.

Or, a broadness of a peak that the EL spectrum of the fourth light 130a has may be larger than a broadness of a peak that the EL spectrum of the third light 120a has throughout the entire range of the visible wavelength band. As a result, the broadness of a peak in the range of the long-wavelength band (e.g. from 500 nm to 770 nm) that the EL spectrum of the fourth light 130a has may be larger than the broadness of a peak in the long-wavelength band (e.g. from 500 nm to 770 nm) that the EL spectrum of the third light 120a has. The integral of the EL spectrum of the third light 120a may be substantially equal to the integral of the EL spectrum of the fourth light 130a with a margin of error.

Or, the highest peak-intensity that the EL spectrum of the fourth light 130a has in the entire range of the visible wavelength band may be weaker than the highest peak-intensity that the EL spectrum of the third light 120a has in the entire range of the visible wavelength band. The integral of the EL spectrum of the third light 120a may be substantially equal to the integral of the EL spectrum of the fourth light 130a with a margin of error.

Or, the intensity in the range of the green wavelength band that the EL spectrum of the fourth light 130a has may be lower than the intensity in the same range of the green wavelength band that the EL spectrum of the third light 120a has. The integral of the EL spectrum of the third light 120a may be substantially equal to the integral of the EL spectrum of the fourth light 130a with a margin of error.

Or, the intensity in the range of the wavelength band from 500 nm to 550 nm that the EL spectrum of the fourth light 130a has may be lower than the intensity in the same range of the wavelength band that the EL spectrum of the third light 120a has. The integral of the EL spectrum of the third light 120a may be substantially equal to the integral of the EL spectrum of the fourth light 130a with a margin of error.

Or, the intensity in the range of the red wavelength band that the EL spectrum of the fourth light 130a has may be higher than the intensity in the same range of the red wavelength band that the EL spectrum of the third light 120a has. The integral of the EL spectrum of the third light 120a may be substantially equal to the integral of the EL spectrum of the fourth light 130a with a margin of error.

Or, the intensity in the range of the wavelength band from 550 nm to 650 nm that the EL spectrum of the fourth light 130a has may be higher than the intensity in the same range of the wavelength band that the EL spectrum of the third light 120a has. The integral of the EL spectrum of the third light 120a may be substantially equal to the integral of the EL spectrum of the fourth light 130a with a margin of error.

Or, a peak or a shoulder which does not exist in the range of red wavelength band in the EL spectrum of the third light 120a may exist in the EL spectrum of the fourth light 130a. That is, the color coordinate tuning layer 130, which does not exist in the range of red wavelength band in the EL spectrum of the third light 120a, can allow a peak or a shoulder to exist in the range of red wavelength band in the EL spectrum of the fourth light 130a. The integral of the EL spectrum of the third light 120a may be substantially equal to the integral of the EL spectrum of the fourth light 130a with a margin of error.

Or, a peak or a shoulder which does not exist in the range of the wavelength band from 550 nm to 650 nm in the EL spectrum of the third light 120*a* may exist in the EL spectrum of the fourth light 130*a*. That is, the color coordinate tuning layer 130, which does not exist in the same range of the wavelength band in the EL spectrum of the third light 120*a*, can allow a peak or a shoulder to exist in the range of the wavelength band from 550 nm to 650 nm in the EL spectrum of the fourth light 130*a*. The integral of the EL spectrum of the third light 120*a* may be substantially equal to the integral of the EL spectrum of the fourth light 130*a* with a margin of error.

When the integral of the EL spectrum of the third light 120*a* is substantially equal to the integral of the EL spectrum of the fourth light 130*a* with a margin of error, it can be considered that the intensity of the EL spectrum in the range of red wavelength band is increased as much as the intensity of the EL spectrum in the range of green wavelength band is reduced as the third light 120*a* is converted into the fourth light 130*a*.

The color filter layer 140 may include a red color filter (not shown) causing the incident fourth light 130*a* to be outputted in red color from a red pixel area (not shown), a green color filter (not shown) causing the incident fourth light 130*a* to be outputted in green color from a green pixel area (not shown), and a blue color filter (not shown) causing the incident fourth light 130*a* to be outputted in blue color from a blue pixel area (not shown). The color filter layer 140 may further include a white color filter (not shown) causing the incident fourth light 130*a* to be outputted in white color from a white pixel area (not shown).

That is, the color filter layer 140 may include the red color filter, the green color filter and the blue color filter for the red pixel area, the green pixel area and the blue pixel area, respectively. If the substrate 110 further includes a white pixel area (not shown), the color filter layer 140 may further include a white color filter (not shown).

The OLED display panel 100 may further include a resin layer (not shown) for adhesion between the color coordinate tuning layer 130 and the color filter layer 140. The refractive index of the resin layer may be smaller than that of the color coordinate tuning layer 130. For the wavelength of 500 nm, the difference in the refractive index between the two layers may range from 0.15 to 0.35. The thickness of the resin layer may range from 2,000 nm to 4,000 nm. For example, for the thickness of 3,000 nm and the wavelength of 550 nm, the resin layer may be a cured-resin layer having the refraction index of 1.5. In this case, the light incident on the color filter layer 140 may be the fourth light 130*a* having passed through the resin layer.

Figure 2:
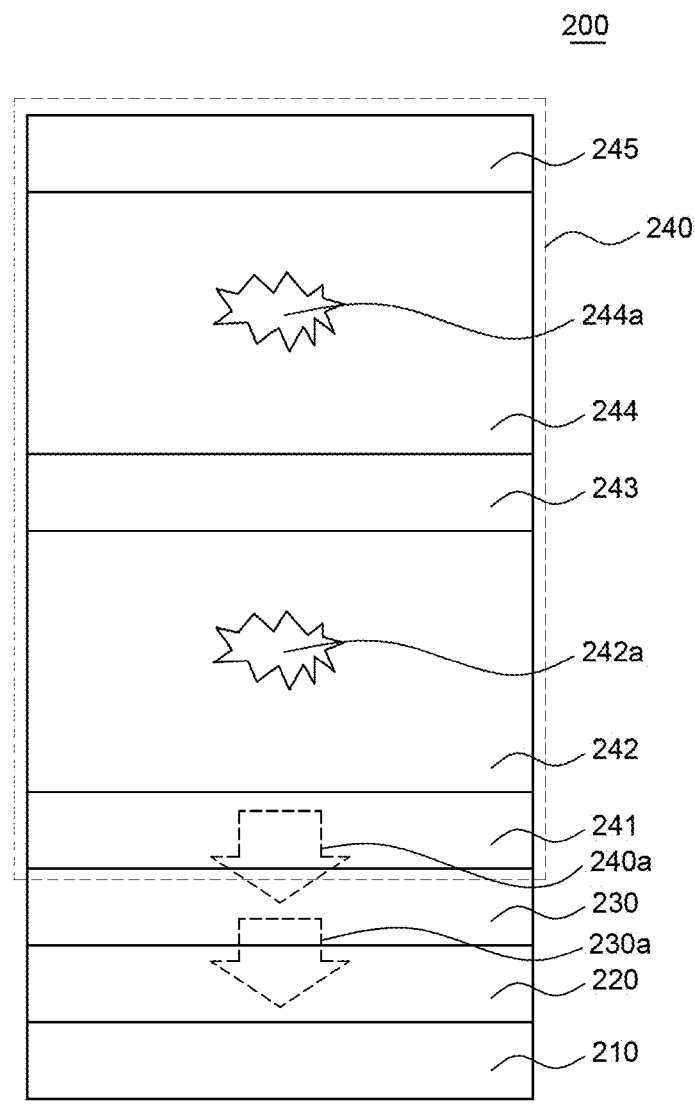
FIG. 2 is a diagram schematically showing a structure of an OLED display panel according to another exemplary embodiment of the present disclosure.

FIG. 2 shows an OLED display panel according to another exemplary embodiment of the present disclosure. Specifically, FIG. 2 schematically shows a bottom-emission white OLED display panel.

Referring to FIG. 2, an OLED display panel 200 according to another exemplary embodiment of the present disclosure includes a substrate 210, a color filter layer 220, a color coordinate tuning layer 230 and an OLED layer 240 disposed on the color coordinate tuning layer 230. The OLED layer 240 includes a lower electrode 241 and an upper electrode 245 facing each other. Further, a first light-emitting portion 242, a charge generating layer 243 and a second light-emitting portion 244 are stacked on one another between the lower electrode 241 and the upper electrode 245. More specifically, the first light-emitting portion 242 may be disposed on the lower electrode 241, the charge generating layer 243 may be disposed on the first light-emitting portion 242, the second light-emitting portion 244 may be disposed on the charge generating layer 243, and the upper electrode 245 may be disposed on the second light-emitting portion 244. The first light-emitting portion 242 may include a first light-emitting layer (not shown) producing a first light 242*a*. The second light-emitting portion 244 may include a second light-emitting layer (not shown) producing a second light 244*a*. Each of the first light-emitting portion 242 and the second light-emitting portion 244 may further include organic layers such as a hole injecting layer (not shown), a hole transporting layer (not shown), an electron injecting layer (not shown) and an electron transporting layer (not shown), for facilitating electron injection and transportation into the first light-emitting layer and the second light-emitting layer.

The lower electrode 241 is made of a material having good light transmissivity and electric conductivity. More specifically, as the first light 242*a* and the second light 244*a* pass through the lower electrode 241, the upper electrode 245 is made of a material exhibiting good light transmissivity throughout the entire range of the visible wavelength band. In addition, as the lower electrode 241 also acts as an electrode, it is made of a material having good electric conductivity. That is, the lower electrode 241 may include a conductive material and may transmit light. If the lower electrode 241 works as a cathode, electrons move between the first light-emitting layer and the lower electrode 241. If the lower electrode 241 works as an anode, holes move between the first light-emitting layer and the lower electrode 241.

The aforementioned descriptions of the substrate 110, the OLED layer 120, the color coordinate tuning layer 130, the color filter layer 140, the first light 121*a*, the second light 124*a*, the third light 120*a* and the fourth light 130*a* of the OLED panel 100 according to the above exemplary embodiment of the present disclosure equally apply to the substrate 210, the OLED layer 240, the color coordinate tuning layer 230, the color filter layer 220, the first light 242*a*, the second light 244*a*, the third light 240*a* and the fourth light 230*a* of the OLED panel 200 according to the another exemplary embodiment of the present disclosure. Therefore, descriptions will be made focusing on the difference between the OLED display panel 100 and the OLED display panel 200, and the redundant description will be omitted.

The color coordinate tuning layer 230 is a layer on which the third light 240*a* passed through the lower electrode 241 of the OLED layer 240 is incident. The refractive index of the color coordinate tuning layer 230 is smaller than the lower electrode 241 which is closer to the color coordinate tuning layer 230 than the other electrode of the OLED layer 240. For the wavelength of 550 nm, the difference in refractive index between the lower electrode 241 and the color coordinate tuning layer 130 may range from 0.15 to 0.35.

Figure 3:
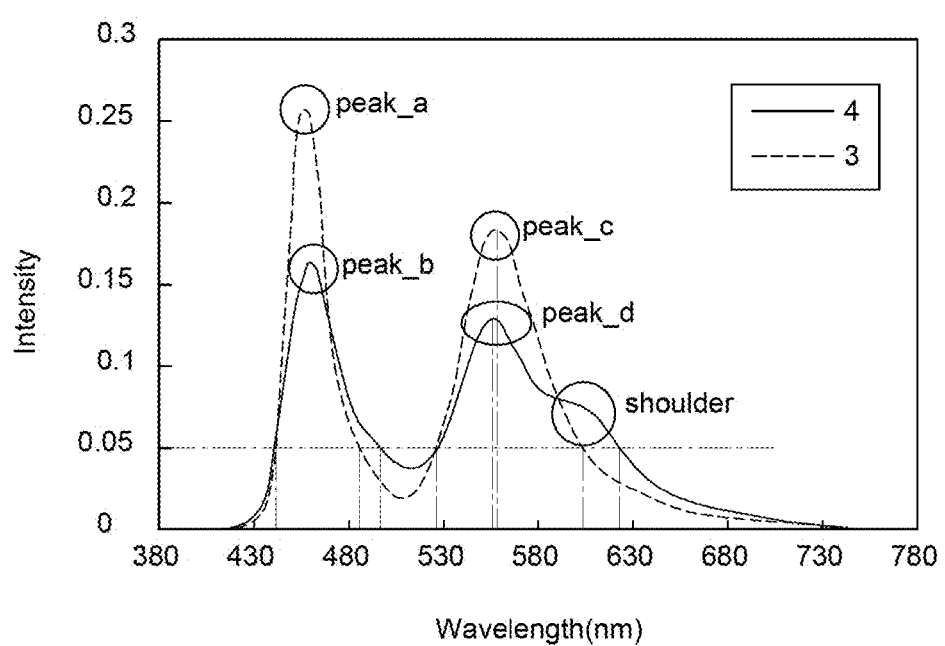
FIG. 3 is a graph showing the EL spectrum of a third light at viewing angle of zero degree that is emitted from an OLED layer to be incident on a color coordinate tuning layer. Also, the EL spectrum of a fourth light at viewing angle of zero degree is outputted from a color coordinate tuning layer to be incident on a color filter layer, in an OLED display panel according to an exemplary embodiment of the present disclosure.

FIG. 3 is a graph of the EL spectrum of the third light 120*a* and the EL spectrum of the fourth light 130*a* in the OLED display panel 100 according to the exemplary embodiment of the present disclosure. In FIG. 3, the EL spectrum of the third light 120*a* is drawn by a dashed line 3 and the EL spectrum of the fourth light 130*a* is drawn by a solid line 4.

Referring to FIG. 3, the peaks of the solid line 4 are lower and wider than that of the dashed line 3. The solid line 4 has a shoulder around the wavelength of 580 nm, which the dashed line 3 does not have. That is, in the range of red wavelength band between 580 nm and 680 nm, there is a region where the intensity of the EL spectrum of the fourth light 130a is higher than the intensity of the EL spectrum of the third light 120a. Such a conversion in the EL spectrums can be made by having the third light 120a to pass through the color coordinate tuning layer 130 to produce the fourth light 130a.

Referring to FIG. 3, the number of all peak-characteristics that the solid line 4 has in the entire range of the visible wavelength band may be higher than the number of all peak-characteristics that the dashed line 3 has in the entire range of the visible wavelength band. For example, if the EL spectrum of the third light 120a has two peaks (peak_a, peak_c) in the entire range of the visible wavelength band, the EL spectrum of the fourth light 130a may have two peaks (peak_b, peak_d) and one shoulder in the entire range of the visible wavelength band. This means that the EL spectrum of the fourth light 130a may additionally have at least a peak-characteristic in the range of a wavelength band other than the ranges of the wavelength band where the EL spectrum of the first light 122a and the EL spectrum of the second light 124a have peak-characteristics, respectively. The integral of the EL spectrum of the third light 120a may be substantially equal to the integral of the EL spectrum of the fourth light 130a with a margin of error.

Referring to FIG. 3, a broadness of peak_b that the solid line 4 has may be larger than a broadness of peak_a that the dashed line 3 has throughout the entire range of the visible wavelength band. A broadness of peak_c that the solid line 4 has may be larger than a broadness of peak_d that the dashed line 3 has throughout the entire range of the visible wavelength band. Specifically, in the range of the long wavelength band from 500 nm to 770 nm, the broadness of peak_d is larger than the broadness of peak_c.

Referring to FIG. 3, in the solid line 4, peak_b has the highest peak intensity among peaks of the EL spectrum of the fourth light 130a in the entire range of the visible wavelength band, and in the dashed line 3, peak_a has the highest peak intensity among peaks of the EL spectrum of the third light 120a. The peak-intensity of peak_b (having the highest peak intensity in the solid line 4) is weaker than the peak-intensity of peak_a (having the highest peak intensity in the dashed line 3).

Referring to FIG. 3, the intensity in the range of the green wavelength band of the solid line 4 is lower than the intensity in the same range of the green wavelength band of the dashed line 3.

Referring to FIG. 3, the intensity in the range of the red wavelength band of the solid line 4 is higher than the intensity in the same range of the red wavelength band of the dashed line 3.

Referring to FIG. 3, a peak or a shoulder which does not exist in the range of red wavelength band in the dashed line 3 exists in the solid line 4. That is, the color coordinate tuning layer 130, which does not exist in the range of red wavelength band in the EL spectrum of the third light 120a, can allow a peak or a shoulder to exist in the range of red wavelength band in the EL spectrum of the fourth light 130a.

In other words, a functional structure, between a color filter layer and an OLED layer of a two-stack OLED structure, configured to process the third light 120a emitted from said OLED layer and output the fourth light 130a that exhibits equal to or more than three peak-characteristics in the EL spectrum of the fourth light 130a. And said functional structure is configured to output the fourth light that includes a particular color corresponding to a range of wavelength having increased intensity compared to a two-stack OLED structure without said functional structure. The said functional structure provides color coordinate tuning that result in said particular color having increased intensity, whereby said particular color may be red. A refractive index of the said functional structure is smaller than that of the upper electrode which is closer to the functional structure than the other electrode of the OLED layer. The said functional structure may include one selected from a group consisting of titanium nitride (TiNx), titanium oxide (TiOx), titanium oxynitride (TiOxNy), silicon nitride (SiN$_x$), silicon oxide (SiO$_x$), silicon oxynitride (SiO$_x$N$_y$), aluminum nitride (AlN$_x$) aluminum oxide (AlO$_x$), aluminum oxynitride (AlO$_x$N$_y$), and a mixture thereof. The thickness of the functional structure may range from 900 nm to 1,200 nm. For example, for the thickness of 1,000 nm and the wavelength of 550 nm, the functional structure may be a single layer of silicon nitride having the refractive index of 1.85. Or, for the wavelength of 550 nm, the functional structure having the thickness of 1,200 nm may be a single layer of aluminum oxide having the refractive index of 1.65. The functional structure may be multiple layers comprised of a combination of the single-layers, if necessary.

In the following, Example 1 and Comparative Example will be described by comparing the performances.

An OLED display panel used in Comparative Example includes a substrate, an OLED layer, a resin layer and a color filter layer. The OLED layer is composed of a lower electrode acting as an anode, a blue light-emitting portion producing blue light, a charge generating layer, a yellow-green light-emitting portion producing yellow-green light, and an upper electrode acting as a cathode. The upper electrode was made of an IZO having the refractive index n=2 at the wavelength band of 550 nm at the thickness of 120 nm. The resin layer was made of a cured resin material having the refractive index n=1.5 at the wavelength band of 550 nm at the thickness of 3,000 nm. That is, no color coordinate tuning layer is employed in Comparative Example. Accordingly, in Comparative Example, the third light is directly incident on the color filter layer without being tuned.

Example 1 employs the OLED display panel 100 according to the exemplary embodiment of the present disclosure. The OLED layer 120 and resin layer (not shown) employed in Example 1 are identical to those in Comparative Example. Additionally, silicon nitride (SiN$_x$) having the refractive index n=1.85 at the wavelength band of 550 nm was formed at the thickness of 1,000 nm between the OLED layer 120 and the resin layer by using a chemical vapor deposition technique. That is, Example 1 employs the color coordinate tuning layer 130 and thus the fourth light 130a is incident on the color filter layer 140.

Table 1 below shows results of a simulation evaluating the diode luminous efficiency and panel efficiency in Cd/A in Example 1 and the Comparative Example. In Example 1, the luminous efficiency in Cd/A was evaluated by defining the substrate 110, the OLED layer 120 and the color coordinate tuning layer 130 as a single diode. In Comparative Example, the luminous efficiency in Cd/A was evaluated by defining the substrate 110 and the OLED layer as a single diode.

TABLE 1

|  | Color | Example 1 | Comparative Example |
|---|---|---|---|
| Diode Luminous Efficiency | Red | 5.08 | 3.43 |
|  | Green | 20.27 | 25.06 |
|  | Blue | 2.95 | 2.98 |

TABLE 1-continued

|  | Color | Example 1 | Comparative Example |
|---|---|---|---|
| (Cd/A) | White | 58.15 | 67.64 |
| Panel Efficiency |  | 22.82 | 21.53 |

As can be seen from Table 1, the luminous efficiency for red was higher in Example 1 than in Comparative Example, and the luminous efficiencies for the other colors were lower in Example 1 than in Comparative Example. However, the panel efficiency was higher in Example 1 than in Comparative Example, in which usage frequency of each of the colors for driving standard moving picture was considered. As a result, the luminous efficiency for red is increased even without using an additional red light-emitting layer. Accordingly, more colorful images can be represented in terms of the overall panel, as the usage frequency of a newly added color gamut is considered in the panel efficiency.

Accordingly, it can be seen that an OLED display panel that includes the color coordinate tuning layer 130 for tuning the third light 120a to produce the fourth light 130a that is incident on the color filter layer 140 has advantages. Such advantages include panel efficiency over an OLED display panel that does not include the color coordinate tuning layer 130 so that the third light 120a is directly incident on the color filter layer 140 without being tuned.

Figure 4:
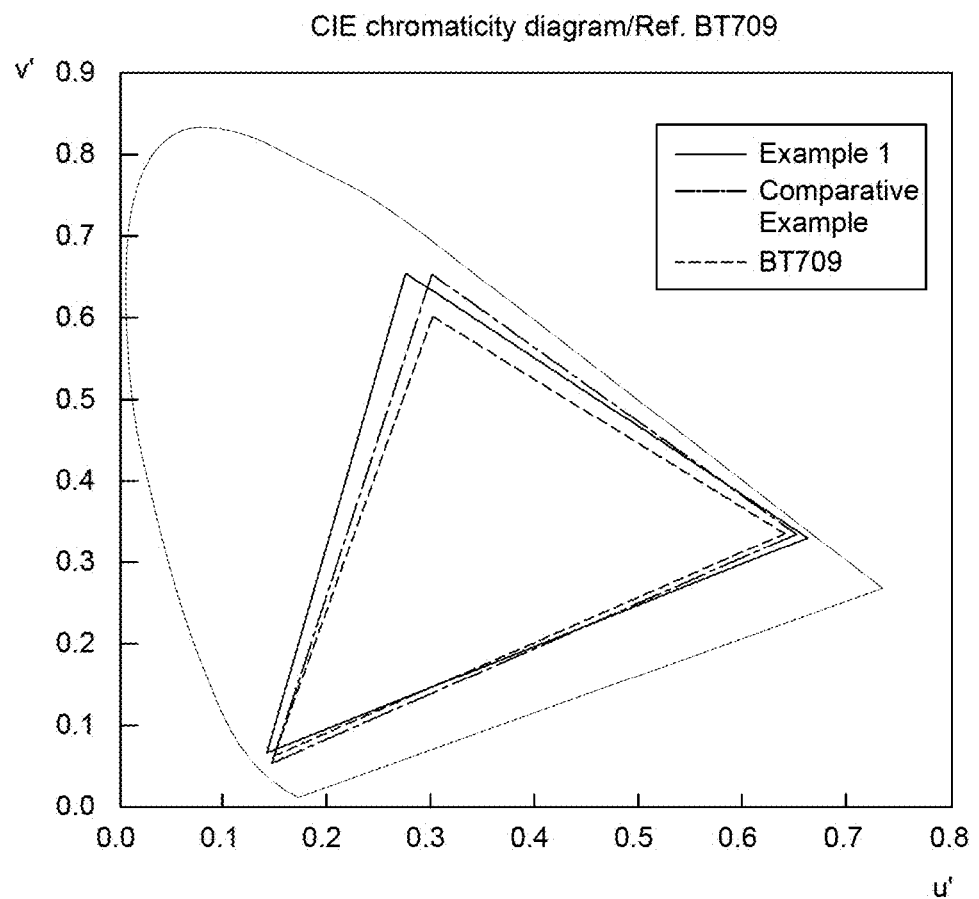
FIG. 4 is a CIE chromaticity diagram in which the BT 709 color gamut, color gamut of Comparative Example and color gamut of Example 1 are depicted.
Figure 5:
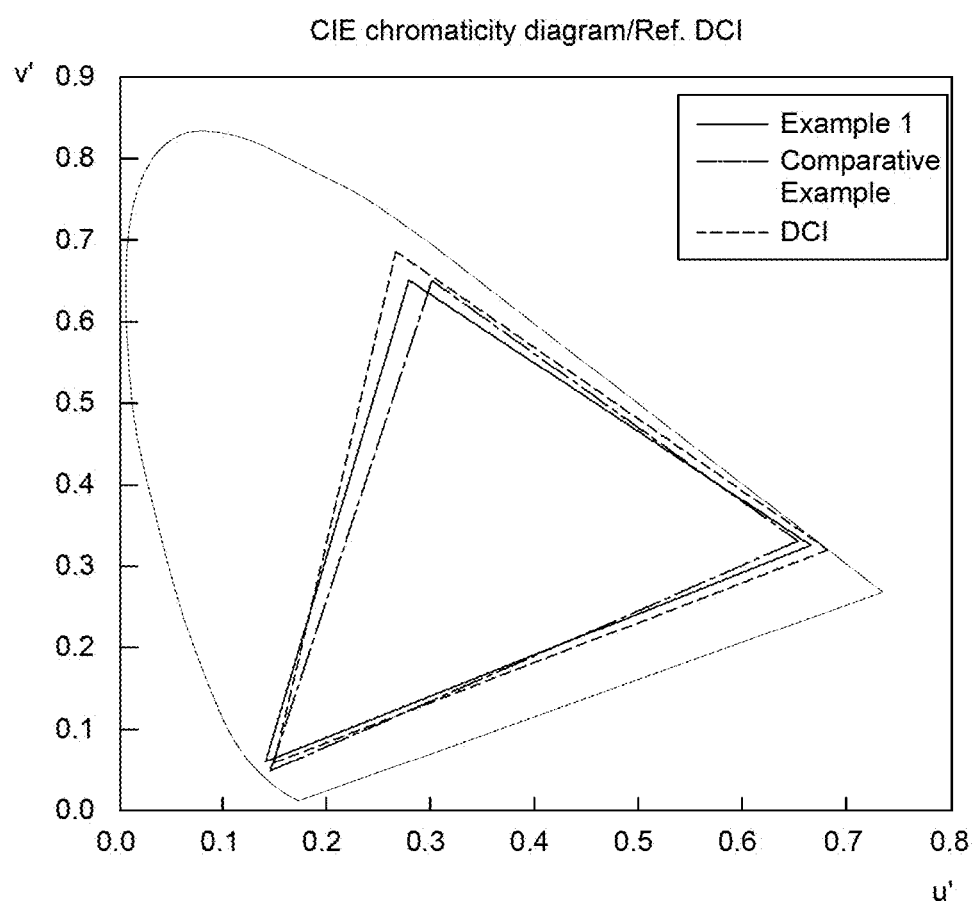
FIG. 5 is a CIE chromaticity diagram in which the DCI color gamut, color gamut of Comparative Example and color gamut of Example 1 are depicted.

FIGS. 4 and 5 are CIE chromaticity diagrams for comparing the color gamut ratios of Comparative Example with that of Example 1. Specifically, FIG. 4 is a diagram showing simulation results of color gamut ratios in Example 1 and Comparative Example in comparison with BT 709 color gamut. FIG. 5 is a diagram showing simulation results of color reproduction ranges in Example 1 and Comparative Example in comparison with DCI color gamut. In FIGS. 4 and 5, Example 1 is drawn by a solid line while Comparative Example is drawn by a dot-and-dashed line. In FIG. 4, BT 709 color gamut is drawn by a dashed line. In FIG. 5, DCI color gamut is drawn by a dashed line. The x-coordinate of the CIE color coordinates is denoted by u'(CIE X). The y-coordinate of the CIE color coordinates is denoted by v'(CIE Y).

Table 2 below shows x-coordinates u' and y-coordinates v' of the vertices on the color coordinates for the BT 709 color gamut in FIG. 4, the DCI color gamut in FIG. 5, the color gamut of Example 1, and the color gamut of Comparative Example.

TABLE 2

|  | FIG. 4 (BT709) | | FIG. 5 (DCI) | | Example 1 | | Comparative Example | |
|---|---|---|---|---|---|---|---|---|
|  | u' | v' | u' | v' | u' | v' | u' | v' |
| Red | 0.640 | 0.330 | 0.680 | 0.320 | 0.664 | .327 | 0.652 | .331 |
| Green | 0.300 | 0.600 | 0.265 | 0.690 | 0.276 | .652 | 0.299 | .652 |
| Blue | 0.150 | 0.060 | 0.150 | 0.060 | 0.141 | .061 | 0.145 | 0.048 |

In FIGS. 4 and 5, it can be intuitively perceived that the color gamut of Example 1 drawn by the solid line is larger than the color gamut of Comparative Example drawn by the dot-and-dashed line. In particular, around red color, the triangle made by the solid line completely overlaps the triangle made by the dot-and-dashed line. Accordingly, it can be seen that Example 1 can represent more colorful images for red color than Comparative Example.

Table 3 below shows color gamut ratios of Comparative Example and Example 1 with respect to BT 709 in FIG. 4 and DCI in FIG. 5, respectively. A color gamut ratio refers to a ratio of color gamut of a display panel of interest with respect to a reference color gamut.

TABLE 3

| Ref. | Color Gamut Ratio of Comparative Example | Color Gamut Ratio of Example 1 |
|---|---|---|
| BT709 (100) | 117% | 122% |
| DCI (100) | 86% | 90% |

With the BT 709 color gamut as the reference, the color gamut ratio of Example 1 is improved by approximately 5% compared to the color gamut ratio of Comparative Example. In addition, with the DCI color gamut as the reference, the color gamut ratio of Example 1 is improved by approximately 4% compared to the color gamut ratio of Comparative Example. In conclusion, it can be seen that Example 1 exhibits an improved color gamut ratio, compared to that of Comparative Example.

Thus far, exemplary embodiments of the present disclosure have been described in detail with reference to the accompanying drawings. However, the present disclosure is not limited to the exemplary embodiments, and modifications and variations can be made thereto without departing from the technical idea of the present disclosure.

Accordingly, the exemplary embodiments described herein are merely illustrative and are not intended to limit the scope of the present disclosure. The technical idea of the present disclosure is not limited by the exemplary embodiments.

Therefore, it should be understood that the above-described embodiments are not limiting but illustrative in all aspects.

The scope of protection sought by the present disclosure is defined by the appended claims and all equivalents thereof are construed to be within the true scope of the present disclosure.

What is claimed is:

1. An organic light-emitting diode (OLED) display panel comprising:
   an OLED layer including a first light-emitting portion configured to emit a first light and a second light-emitting portion configured to emit a second light, the OLED layer being configured to emit a third light produced by mixing the first light and the second light;
   a color filter layer;
   a color coordinate tuning layer disposed between the OLED layer and the color filter layer, the color coordinate tuning layer being configured so that the third light passes though the color coordinate tuning layer to output a fourth light; and
   a resin layer between the color coordinate tuning layer and the color filter layer, wherein the resin layer has a refractive index being smaller than a refractive index of the color coordinate tuning layer,
   wherein a thickness of the color coordinate tuning layer ranges from 900 nm to 1,200 nm such that a number of all peaks and shoulders that an EL spectrum of the fourth light has is greater than a number of all peaks and shoulders that an EL spectrum of the third light has throughout an entire range of a visible wavelength band, wherein the color coordinate tuning layer includes one selected from a group consisting of titanium nitride (TiNx), titanium oxide (TiOx), titanium oxynitride (TiOxNy), aluminium nitride (AlNx), aluminum oxynitride (AlOxNy), and wherein the color coordinate tuning layer is a single layer.

2. The display panel of claim 1, wherein a broadness of a peak that the EL spectrum of the fourth light has is larger than a broadness of a peak that the EL spectrum of the third light has throughout an entire range of a visible wavelength band.

3. The display panel of claim 2, wherein a broadness of the peak in a long wavelength band that the EL spectrum of the fourth light has is larger than a broadness of the peak in the same long wavelength band that the EL spectrum of the third light has.

4. The display panel of claim 1, wherein the color coordinate tuning layer is configured to convert the third light into the fourth light such that a peak or a shoulder, which does not exist in the EL spectrum of the third light, exists in the EL spectrum of the fourth light.

5. The display panel of claim 1, wherein the color coordinate tuning layer is configured to convert the third light into the fourth light such that a peak-intensity in the EL spectrum of the fourth light is lower than a peak-intensity in the EL spectrum of the third light.

6. The display panel of claim 1, wherein the OLED layer further comprises an upper electrode and a lower electrode facing each other, wherein the refractive index of the color coordinate tuning layer is smaller than a refractive index of one of the upper electrode and the lower electrode that is closer to the color coordinate tuning layer.

7. The display panel of claim 1, wherein the third light is white light.

8. The display panel of claim 1, wherein one of the first light and the second light is blue light and the other is yellow-green light.

9. The display panel of claim 8, wherein the EL spectrum of the fourth light has a peak or a shoulder in a range of a red wavelength band.

10. The display panel of claim 1, wherein a peak or a shoulder exhibited only in the EL spectrum of the fourth light compared to the EL spectrum of the third light is a peak and a shoulder in a range of a red wavelength band.

11. The display panel of claim 1, wherein an intensity of the EL spectrum of the fourth light is higher than an intensity of the EL spectrum of the third light in a part of a range of a red wavelength band.

12. The display panel of claim 1, wherein the color coordinate tuning layer is configured to convert a light emitted from the first light-emitting portion and the second light-emitting portion into a light having an additional peak or shoulder in a wavelength band of a different color from a color that the first light-emitting portion and the second light-emitting portion emit and to output the converted light.

13. The display panel of claim 1, wherein the difference in the refractive index between the resin layer and the color coordinate tuning layer ranges from 0.15 to 0.35, for a wavelength of 550 nm.

14. A display apparatus comprising:
a functional structure, between a color filter layer and an OLED layer of a two-stack OLED structure, configured to process a light emitted from the OLED layer and output a light that exhibits equal to or more than three peak-characteristics in an EL spectrum,
wherein the functional structure comprises a color coordinate tuning layer and a thickness of the color coordinate tuning layer ranges from 900 nm to 1,200 nm;
a resin layer between the color coordinate tuning layer and the color filter layer, wherein the resin layer has a refractive index being smaller than a refractive index of the color coordinate tuning layer,
wherein the color coordinate tuning layer includes one selected from a group consisting of titanium nitride (TiNx), titanium oxide (TiOx), titanium oxynitride (TiOxNy), aluminium nitride (AlNx), aluminum oxynitride (AlOxNy), and
wherein the color coordinate tuning layer is a single layer.

15. The display apparatus of claim 14, wherein the functional structure is configured to output the light that has an EL spectrum including a particular range of wavelength having increased intensity compared to a two-stack OLED structure without the functional structure.

16. The display apparatus of claim 15, wherein the functional structure provides color coordinate tuning that results in a particular color corresponding to the particular range of wavelength having increased intensity, whereby the particular color is red.

17. The display apparatus of claim 14, wherein the peak-characteristics includes a peak and a shoulder.

18. The display apparatus of claim 14, wherein the difference in the refractive index between the resin layer and the color coordinate tuning layer ranges from 0.15 to 0.35, for a wavelength of 550 nm.

* * * * *